United States Patent
Kolics et al.

(10) Patent No.: US 6,902,605 B2
(45) Date of Patent: *Jun. 7, 2005

(54) ACTIVATION-FREE ELECTROLESS SOLUTION FOR DEPOSITION OF COBALT AND METHOD FOR DEPOSITION OF COBALT CAPPING/PASSIVATION LAYER ON COPPER

(75) Inventors: Artur Kolics, San Jose, CA (US); Nicolai Petrov, Santa Clara, CA (US); Chiu Ting, Saratoga, CA (US); Igor Ivanov, Dublin, CA (US)

(73) Assignee: Blue29, LLC, Sunnyvale, CA (US)

( * ) Notice: Subject to any disclaimer, the term of this patent is extended or adjusted under 35 U.S.C. 154(b) by 8 days.

This patent is subject to a terminal disclaimer.

(21) Appl. No.: 10/379,692

(22) Filed: Mar. 6, 2003

(65) Prior Publication Data

US 2004/0175509 A1 Sep. 9, 2004

(51) Int. Cl.⁷ .................. C23C 18/34; C23C 18/36; B05D 1/18
(52) U.S. Cl. .................. 106/1.22; 106/1.27; 427/443.1; 427/437
(58) Field of Search .............. 106/1.22, 1.27; 427/443.1, 437

(56) References Cited

U.S. PATENT DOCUMENTS

| | | | |
|---|---|---|---|
| 3,977,884 A | 8/1976 | Gulla et al. ................ 106/1.26 |
| 4,002,778 A | 1/1977 | Bellis et al. | |
| 5,695,810 A | 12/1997 | Dubin et al. | |
| 6,180,523 B1 | 1/2001 | Lee et al. | |
| 6,479,384 B2 | 11/2002 | Komai et al. | |
| 6,486,055 B1 | 11/2002 | Jung et al. | |
| 6,645,567 B2 * | 11/2003 | Chebiam et al. ......... 427/443.1 |
| 6,717,189 B2 * | 4/2004 | Inoue et al. ................ 257/200 |
| 2002/0084529 A1 | 7/2002 | Dubin et al. ................ 257/774 |
| 2003/0113576 A1 | 6/2003 | Chebiam et al. ........... 428/670 |
| 2003/0134047 A1 | 7/2003 | Dubin et al. ................ 427/421 |
| 2003/0221612 A1 | 12/2003 | Dal et al. ..................... 118/72 |
| 2003/0235658 A1 | 12/2003 | Shacham-Diamand et al. .. 427/437 |
| 2004/0035316 A1 * | 2/2004 | Chebiam et al. ........... 106/1.22 |
| 2004/0038073 A1 * | 2/2004 | Chebiam et al. ............ 428/668 |

FOREIGN PATENT DOCUMENTS

| | | |
|---|---|---|
| JP | 9-307234 | 11/1997 |
| JP | 2000-256866 | 9/2000 |

OTHER PUBLICATIONS

Hideo Watanabe, et al., 1998 IEMT/IMC Proceedings, pp. 149–153, no date available.
International Search Report, PCT/US2004/006607, mailed Aug. 18, 2004.
Electroless Plating, fundamentals and applications, ed. G.O.Mallory and J.B.Hajdu, AESF reprint 1999, no month.

* cited by examiner

Primary Examiner—Helene Klemanski
(74) Attorney, Agent, or Firm—Mollie E. Lettang; Daffer McDaniel, LLP

(57) ABSTRACT

The present invention relates to compositions and a method for electroless formation of alkaline-metal-free coatings on the basis of cobalt and composition of cobalt with tungsten and phosphorus, which have high resistance to oxidation and stability of electrical characteristics, when the Co—Cu system layer is used in IC chips. The composition of the electroless solution contains more than one reducing agents, one of which can catalyze the initial electroless deposition layer of cobalt on copper (called initiator), while the other maintains deposition of cobalt on the aforementioned initial layer as the process is continued. Small amount (100–5000 ppm) of elements from the initiator also builds into the electroless film, which is expected to further improve the barrier properties of the resultant film compared to the deposition bath without initiator. Such coating may find application in semiconductor manufacturing where properties of deposited films and controllability of the composition and physical and chemical characteristics of the deposited films may be critically important.

34 Claims, No Drawings

ACTIVATION-FREE ELECTROLESS SOLUTION FOR DEPOSITION OF COBALT AND METHOD FOR DEPOSITION OF COBALT CAPPING/PASSIVATION LAYER ON COPPER

FIELD OF THE INVENTION

The present invention relates to a method and solution for electroless deposition of cobalt and cobalt alloys, in particular to electroless deposition of thin films of, phosphorus metal systems, such as a Co—W(Mo, Cr)—P—B system, or the like, onto a copper surface. The invention may find application in the manufacture of capping/passivation layers, e.g., on conductive interconnects of semiconductor devices.

BACKGROUND OF THE INVENTION

Copper is increasingly replacing aluminum in interconnects fabrication in ultra large scale (ULSI) microelectronic devices. Nevertheless, this technology faces a few problems such as metal corrosion, weak adhesion, high chemical reactivity, and considerable diffusion of copper in silicon. One of the recent approaches to successfully address these issues is the formation of barrier/capping layers by electroless deposition. Thin films, such as films of Co—W—P and Ni—Re—P prepared by electroless deposition have already been shown to have potential application as capping/passivation layers on copper films. These films are characterized by lower resistivity, lower manufacturing costs than other barriers, and deposition conformity.

Electroless deposition is a process for depositing a thin layer or layers of a material or materials onto a substrate, which normally consists of immersing the substrate in a deposition bath that contains ions of the material to be deposited, whereby some of these ions precipitate onto the surface of the substrate. In contrast to electroplating processes, the electroless deposition process does not need an externally applied electric field to facilitate the deposition process. An advantage of an electroless deposition process is that it can be selective, i.e., the material can be deposited only onto areas that demonstrate appropriate electrochemical properties. Therefore, local deposition can be performed more effectively onto metals that exhibit an affinity to the material being deposited or onto areas pretreated or pre-activated, e.g., with a catalyst. The material or catalyst applied prior to deposition onto the selected areas is sometimes called a "seed material" or "seed layer" and the ratio of the deposition rate on the activated regions to the deposition rate at the non-activated regions is known as the "deposition process selectivity". It is understood that the deposition rate may also depend on characteristics of the activated areas, such as dimensions, profiles of the exposed surfaces, and distances between the portions of the areas to be activated.

For many applications, it is very important to provide deposition of uniform thickness. Other important characteristics of the electroless deposition are selectivity of the process and adherence of the deposited layer to the substrate.

Electroless deposition of various metals from deposition solutions onto catalytically pretreated surfaces has been widely used in the past in the printed circuit board industry for the production of wiring layers and interlayer connections. Later, the technique was transferred to the semiconductor industry for the production of metal interconnects in semiconductor (IC) chips. The electroless deposition technique is advantageous over other known metal deposition techniques such as different types of sputtering and evaporations. One advantage is the use of less expensive equipment. Another advantage is selectivity and controllability of the process. For example, deposition can be performed only onto pretreated areas. As a result, it becomes possible to reduce the number of lithographic and etching steps, which are the most expensive stages of the semiconductor manufacture. Another advantage is that electroless deposition well matches the present trend for using copper as interconnect materials instead of aluminum, silicides, or the like. It is well known that the new generations of LSI are associated with the use of copper, which possesses very high electrical conductivity. The problem encountered by traditional techniques (that include anisotropic etching) in transfer to copper is that copper is difficult to etch anisotropically. Yet another advantage of electroless deposition is that it to a lesser degree depends on such features of the substrate surface as angles or depth of trenches and vias, etc. This property enables deposition into deep via holes on substrates that could not be uniformly covered by sputtering and evaporation.

Many surface activation techniques that precede electroless deposition are known in the art. The most common applications of electroless deposition to integrated circuit manufacturing comprise deposition of nickel, cobalt, palladium, or copper onto one of two types of substrate surfaces. The first type of substrate surface comprises conductive regions of substrates that are generally formed of silicon, aluminum, or aluminum alloys. The second type of substrate comprises a non-conductor such as silicon dioxide or a polymeric insulator. The reported surface activation techniques applied to these substrates usually fall into one of four categories: (1) catalyst film deposition by evaporation or sputtering, (2) catalyst film deposition by electrochemical or chemical surface modification, (3) catalytic film deposition from a colloidal suspension; (4) photon-enhanced activation by laser or wide spectrum irradiation.

Metals of Group VIII (e.g., palladium and platinum) are frequently used as catalytic surface activators in electroless deposition methods. Catalytic films of palladium or platinum for subsequent electroless deposition can be readily deposited by evaporation or sputtering techniques. The films deposited with these techniques can be patterned by well-known lithographic techniques, e.g., subtractive etching or liftoff. Large features and/or dense patterns of small features are relatively easy to plate with this method.

It has been found Out that in electroless deposition palladium activation from aqueous solutions demonstrates higher catalytic activity of films than of palladium films deposited by sputtering or evaporation (see U.S. Pat. No. 6,180,523 issued in 2001 to Chwan-Ying Lee, et al.). The reduced catalytic activity results in the formation of a less uniform films. Furthermore, it becomes more difficult to deposit a film on small and isolated features such as metallization patterns on semiconductor devices.

There are known various methods suitable for improving catalytic activity of the surface with the use of palladium prior to electroless deposition.

As has been mentioned above, copper is not easily dry-etched. Therefore, in the formation of a copper wiring, a process of forming a trench wiring is promising. The trench wiring is produced by a process in which a predetermined trench is preliminarily formed in an interlayer dielectric comprised of, for example, silicon oxide, and the trench is plugged with a wiring material. Then, the excess wiring material is removed by, for example, a chemical mechanical polishing (hereinafter, frequently referred to simply as "CMP") process, to thereby form a wiring in the trench.

The copper wiring is generally used in the form of a multilayer wiring. When such a multilayer copper wiring is formed, no barrier film, which prevents copper from diffusing, is present on the surface of the copper wiring. Therefore, before an upper layer wiring is formed on the copper wiring, as a diffusion-preventing film for copper, a barrier film comprised of silicon nitride, carbon nitride or the like is formed on the copper wiring. Silicon nitride, silicon carbide, and silicon oxynitride have a relative dielectric constant larger than that of silicon oxide and significantly larger than low-K dielectric materials. Therefore, it is considered that these are advantageous in a method in which the surface of copper after the CMP process is selectively coated with these. In addition, U.S. Pat. No. 5,695,810 issued to V. Dubin, et al. on Dec. 9, 1997 discloses a method in which the surface of copper is coated with a cobalt tungsten phosphorus (Co—W—P) film. In this method, cobalt tungsten phosphorus is deposited by an electroless plating method using the surface of copper as a catalyst.

A disadvantage of the above method is that such a process is characterized by a low deposition rate and increased sensitivity to copper surface cleanliness.

Further, Japanese Patent Application Laid-Open Specification No. 9-307234 filed by Yo. Funada, et al., on May 20, 1996 (which is one of basic applications of U.S. Pat. No. 5,830,563) discloses a method used in a printed-wiring substrate, in which the exposed copper surface is subjected to palladium displacement plating, and electroless plating is conducted using the displaced palladium as a catalyst nucleus. On the other hand, as a catalyst activation treatment for electroless plating, a method in which palladium ions are reduced utilizing an oxidation reaction of tin ions, a method using a palladium sol, a method using a silane coupling agent, and the like are known.

In the palladium catalyst method used in general electroless plating, it is known that palladium is present in an island form on the entire surface of both the copper wiring and in many cases on the interlayer dielectric film. In this case, a barrier layer comprised of cobalt tungsten phosphorus is formed by deposition using, as a catalyst nucleus, the palladium formed in an island form on the entire surface of copper wiring and, in many cases, on the surfaces of interlayer dielectric films, especially on those formed by high carbon content materials. Therefore, the barrier layer, which grows using such palladium as a nucleus, is likely to be also a non-uniform film. In addition, for forming the barrier layer as a continuous film on the entire surface of both the copper wiring and the interlayer dielectric film, it is necessary to increase the thickness of the barrier layer, and the thickness depends on the density of the palladium formed in an island form. Such problems make it difficult to control the process.

Further, in the aforementioned known palladium catalyst methods, it is difficult to selectively form a palladium catalyst layer on a copper wiring, and thus, palladium elements disadvantageously adsorb onto the entire surface to be treated. In addition, in the palladium catalyst method using tin ions, it is confirmed that tin elements are drawn into the palladium layer, and problems are encountered in that tin causes the wiring resistance to rise and the long-term reliability of the wiring to be poor.

Attempts have been made to solve the above problems by a method disclosed in U.S. Pat. No. 6,479,384 issued on Nov. 12, 2002 to Naoki Komai, et al. This patent describes a process for fabricating a semiconductor device by forming on a copper wiring a barrier layer, which functions, as a diffusion-preventing film. A catalytic metal film, which serves as a catalyst in the electroless plating method, is selectively formed on the copper wiring by a displacement deposition method using a displacement deposition solution at a temperature about 30° C., and the barrier film is selectively formed on the catalytic metal film by electroless plating. The purpose of the aforementioned invention is to selectively and uniformly carry out the catalytic activation on the surface of the metal wiring made of copper or a copper alloy by using palladium so as to improve reliability of the wiring and plating property of the electroless plating method using a hypophosphite as a reducing agent. More particularly, the aforementioned process is intended for fabricating a semiconductor device using a trench wiring technique, such as a dual Damascene process or a single Damascene process.

U.S. Pat. No. 6,486,055 issued in 2002 to Chan-Hwa Jung, et al. discloses a method for forming copper interconnections in semiconductor component using electroless plating system, which enables copper to be grown only in corresponding interconnection regions. In such a method, a wafer is cleaned and pretreated with a palladium seed solution so as to cause spontaneous catalytic activation, and simultaneously the process temperature is varied to grow metal seed particles from the metal seed pretreating solution. The wafer is cleaned to remove the metal seed from the wafer surface, and the wafer is finally plated with an electroless plating bath to grow copper in the metal seed formed regions. This method simplifies the processes and reduces process costs by substituting a wet process for the existing vacuum pretreating process. Also, a wafer planarization process can be omitted by selectively growing copper only in desired interconnections. Compared with the existing ultraviolet radiation photolithography process, the selective copper growth process of the method has an advantage of relative simplicity.

In all the methods described above, catalytic activation of the surface to be treated is based on the use of palladium. However, activation of semiconductor substrate surfaces with palladium has a number of disadvantages which are the following: 1) palladium is a very expensive material and therefore the use of palladium makes the entire process expensive; 2) palladium is not a readily available material and in commercial quantities is available only from a few countries; 3) palladium activation is carried out by deposition of palladium; however, at the initial stage of deposition palladium precipitates in the form of islands, which are growing simultaneously in three directions with non-controllable growth; this results in the formation of rough surfaces on the subsequent stages of deposition; 4) since palladium possesses low selectivity, it may be easily absorbed by the polymeric surface (low-K polymers) that may surround the copper area onto which palladium is precipitated; 5) Traces of palladium from the pretreated substrates can be transferred into electroless deposition solution and cause rapid decomposition of said solution.

U.S. Pat. No. 4,002,778 issued in 1977 to H. Bellis et al. describes a process of electroless deposition of nickel or cobalt onto conductive substrates without the use of palladium as a seed layer. However, the solution offered by the authors contains salts of alkali-metals, which are extremely undesirable for use in semiconductor devices.

The applicants made an attempt to solve the problems of the prior art by developing a method for selective deposition of Co—W—P system films onto copper with palladium-free activation. This method is disclosed in earlier U.S. Patent Application No. 10/345,134, submitted by the applicants on Jan. 13, 2003. The method consists of creating the aforementioned complexes on the copper surfaces prior to electroless deposition of a Co—W—P system films. This is achieved in a three stage process: immersing the substrate into a pretreatment solution; rinsing the pretreated substrate; and forming the final electroless deposition. Deposition was carried out with the use of reducing agents, such as hypophosphorous-acid-based or borane-based reducing agents such as dimethylamine borane.

A disadvantage of the solution and method described in the aforementioned U.S. Patent Application is that the deposition process is a multiple-stage process with exposure of the treated substrate to the surrounding atmosphere in each stage. This makes the process time-consuming and might cause an excessive corrosion of copper substrate.

As has been mentioned above, the electroless deposition of phosphorouscontaining barriers is conveniently performed in a bath utilizing hypophosphite as a reducing agent. In contrast, boron-containing barriers, such as Co—W—B, are deposited from solutions having a borane- or borohydride-type reducing agent, e.g., aminoboranes.

In a typical electroless deposition process of Co alloys onto copper substrate using hypophosphite the oxidation of reducing agent and release of an electron is done on the surface of catalytically active substrate such as palladium or, as described by the same authors in previous U.S. patent application Ser. No. 10/345,134, (Pd-free activation), on the surface of copper hydride. Since it is accepted that DMAB is going into cleavage of the N—H bond (Electroless Plating, fundamentals and applications, ed. G. O. Mallory and J. B. Hajdu, AESF reprint 1999), a low level of DMAB in hypophosphite based electroless solution should reduce $Cu_xO$ on the surface of copper substrate and form surface layer of $Cu_xH$ which in turn will act as a catalytic substrate for consequent oxidation of hypophosphite producing Co alloy with controlled concentration of P according to electroless mechanisms described elsewhere.

Simplified mechanism can be described as follows:

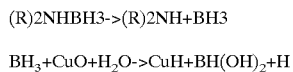

$BH_3+CuO+H_2O->CuH+BH(OH)_2+H$

Known in the art is a process of direct electroless nickel plating on copper circuits with the use of a dimethylamineborane as a second reducing agent (see the article by Hideo Watanabe, et al., 1998 IEMT/IMC Proceedings, pp. 149–153). In this method, the use of palladium catalyst treatment is excluded by adding dimethylamineborane to the electroless deposition bath as a second reducing agent. The specific method described in the above article was intended for electroless deposition exclusively of nickel films onto circuit boards having high-density copper patterns.

It is known, however, that a Ni—Cu system has a tendency to a continuous formation of solid solutions (see Vacarro Williams Apr. 28, 1996, http://www.eng.vtedu/eng/materials/classes/ MSE2094_NoteBook/96ClassProj/examples/cu-ni.html). A good example of Ni—Cu alloys is a German silver (cupronickel alloy) which finds wide application in the manufacture of domestic cutlery. The aforementioned property of the Ni—Cu systems will cause constant diffusion of nickel into copper on the Ni—Cu interface, which, in turn, will lead to constant long-term variation in the properties of the electric circuits formed by the copper component. If such variations were to some extent acceptable for PC boards mentioned in the aforementioned article, they are absolutely unacceptable for IC chips of modem semiconductor devices.

More specifically, if the thickness of the copper interconnect is about 3000 Angstroms and the thickness of the nickel barrier layer is about 100 Angstroms, a mixing ratio of Ni and Cu may be about 1:30. This may lead to a noticeable change of electrical resistance in the interconnects which is unacceptable.

Therefore the above method, based on the use of dimethylamineborane as a second reducing agent, did not find practical application in the semiconductor industry.

SUMMARY OF THE INVENTION

The present invention relates to compositions and a method for palladium-free electroless formation of alkali-metal-free coatings on the basis of cobalt and compositions of cobalt with tungsten and phosphorus, which have high resistance to oxidation. The composition of the electroless solution contains at least two reducing agents, one of which can catalyze the initial electroless deposition layer on copper (called initiator), while the other maintains deposition on the aforementioned catalyzed copper surface as the process is continued. Small amount (100–5000 ppm) of elements from the initiator also builds into the electroless film, which is expected to further improve the barrier properties of the resultant film compared to the deposition bath without the initiator. Such coatings may find application in semiconductor manufacturing where properties of deposited films and controllability of the composition and physical and chemical characteristics of the deposited films may be critically important.

It is an object of the present invention to provide a single-stage process for electroless deposition of a capping/passivation layer on copper interconnects with the use of one or more reducing agents that improves barrier properties of the layer. It is another object to provide the aforementioned method, which can be completed in a short period of time and at lower cost. It is a further object of the invention to provide a method, which, in contrast to the conventional methods with the use of hypophosphite-based cobalt bathes, does not require activation in a multiple-stage process.

DETAILED DESCRIPTION OF THE INVENTION

The present invention relates to the use of one or more agents, which the applicants call "deposition initiators" in the electroless bath that initiate deposition on an otherwise directly non-platable copper. As soon as a few monolayers of cobalt are formed on the copper surface, an activation layer is formed, which makes the process autocatalytic through hypophosphite oxidation. The hypophosphite concentration has 20–100-fold higher molar concentrations than the initiator species. With this concentration ratio, the effect of the deposition of boron, included in the initiator, on the deposited film will be insignificant, and therefore the composition of the layer will be identical to the one deposited using, e.g., palladium activation and deposition initiator-free Co—W—P electroless bath. Further advantages of the proposed method are elimination of a separate activation stage, decrease in cost, improvement m the quality of the deposited film, and elimination of cross-contamination of electroless deposition solution by a metallic catalyst such as palladium.

In order to better understand the principle of the present invention that allows a single-stage palladium-free electroless deposition of the aforementioned films onto copper, it would be advantageous to consider possible mechanisms of the process of the invention.

It is obvious that copper itself may act as a catalyst in electroless deposition. However, copper oxides CuO and $Cu_2O$ initiate undesired catalysis that leads to violation of the structure in the precipitated metal films and hence to deterioration of quality in the coating layer.

Enrichment with boron, especially on the side of the copper surface, does not noticeably affect the properties of the deposited metals due to low concentration of aminoboranes, but rather slightly improves anti-corrosive properties of the coating film. As far as the use of cobalt (and with some deviations rhenium, tungsten, and molybdenum) are concerned, mechanisms of their autocatalytic deposition are slightly different from those relating to nickel and are characterized by high stability against diffusion of cobalt into the copper layer.

The deposition initiator should be prepared preferably from alkyl borane group, i.e., $R1R2R3NB_nH_{2n+1}$, where R1, R2, and R3 are different or identical alkyls, aryl groups or hydrogen atoms, and n is an integer with values preferably below 5. One specific example of the above compound is dimethylamine borane (DMAB). When this compound is used in concentration of 0.001 to 0.01 M in the Co—W—P electroless bath, no separate activation step is needed to form a Co—W—P layer on copper.

The palladium-free electroless deposition solution of the invention contains two reducing agents of two different categories, i.e., an initiator (aminoboranes) which imparts copper the required catalytic properties and a reducing agent which is contained in the solution volume.

A typical electroless deposition solution of the invention for deposition, e.g., of a Co—W—P—B system film may include, e.g., the following components:

(1) A first metal ion source, which is a source of Co and may comprise practically any soluble cobalt (II) salt, preferably such cobalt salts as cobalt sulfate and cobalt chloride. The use of high purity cobalt (II) hydroxide would be even more advisable.

(2) A second metal ion source, which is a source of W. Mo or Cr. and may comprise a tungsten (VI) compound, generally tungsten (Vi) oxide ($WO_3$) or tungsten phosphoric acid $H_3 [P(W_3O_{10})_4]$. Tungsten in other oxidation states, such as V or IV, is also applicable.

(3) A source of phosphorus and a reducing agent, which reduces the ions of the metal in the solution into a metal layer on the substrate surface. The preferred source and agent of this type is a hypophosphorous acid. Other reducing agents of this type may be represented by hydrazine and ammonium hypophosphite.

(4) A source of boron, which is used as an initiator, e.g., alkylaminoborane.

(5) A ligand source, such as amines, e.g., dimethylamines, acids, such as a citric acid, acrylic acid, tetramethylammonium hydroxide (TMAH), or the like.

(6) A stabilization agent, such as alkylamines, polypropylene glycol, or the like.

(7) A buffering agent and a source of boron, if needed. The most common compound for the buffer solution in the pH range 8 to 10 is a boric acid.

(8) A surfactant.

In the case of deposition, e.g., of a Co—W—B—P film, the method of the invention is a single-stage operation comprising: preparing a solution of the type described above, wherein the initiator in the form of aminoboranes and a reducing agent in the form of hypophosphorous acid are added in such a ratio that concentration of the aminoboranes becomes 100–5000 ppm, and concentration of hypophosphorous acid becomes 2000–500,000 ppm; bringing the copper surface into contact with the aforementioned solution to form on the copper a first metal layer initiated by the aminoborane and, after the formation of the first layer, forming a hypophosphorous reducing agent which is capable of depositing a metal, which in this example is cobalt, onto the aforementioned first initiated layer.

PRACTICAL EXAMPLE 1

One liter of an electroless deposition solution was prepared with the following composition: 86.5 g citric acid monohydrate ($C_6O_7H_8xH_2O$) and 28 ml of 50 wt. % aqueous solution of hypophosphorous acid ($H_3PO_2$) (reducing agent) were dissolved in 100 ml of deionized water. After complete homogenization of the solution, 18 g cobalt sulfate heptahydrate ($CoSO_4x7H_2O$) were added into a container holding the above mentioned solution. When the cobalt salt dissolved completely, 75 ml of TMAH were added to the above solution followed by the addition and dissolution of 15.5 g boric acid ($H_3BO_3$). In a separate container 17 g of tungsten (VI) oxide ($WO_3$) were added to 300 ml 25 wt. % tetramethylammonium hydroxide (TMAH), and the mixture was heated up to 75° C. The obtained mixture was kept at an elevated temperature till the oxide dissolved in TMAH. When the deposition on copper was performed at a bath temperature of 90° C., the deposition rate reached 200 Angstrom/min. The composition of deposited film comprised of 8–9.5 atomic % phosphorous, 2.5–3 atomic % tungsten, and cobalt as the balance.

The minimum DMAB concentration was 1 g/l, the preferred maximum was 2 g/l (without changing the composition of the film). At pH higher than 10, it was impossible to obtain a deposited film of a stable composition. Therefore, in some embodiments, it may be advantageous for the electroless deposition solution to have a pH value not exceeding 10. The electroless deposition process was carried out in a single stage at temperature from 20 to 100° C. The preferable temperature was 87 ° C. In some embodiments, the electroless deposition process may be carried out at a temperature between approximately 20° C. and approximately 110° C. or more particularly, between approximately 40° C. and approximately 110° C.

Analysis showed that films deposited from the electroless deposition solution prepared in Practical Example 1 showed that the Co—W—P—Cu system constantly maintained stability of electrical properties.

COMPARATIVE EXAMPLE 1

Deposition was carried out with the same electroless deposition solution as in Practical Example one, with the exception that the solution pH exceeded 10. The deposition process was unstable, and the resulting deposited film had unstable composition.

COMPARATIVE EXAMPLE 2

Deposition was carried out with the same electroless deposition solution as in Practical Example 1, with the exception that the deposition temperature was 40° C. The process was stable, but the deposition rate was below 50 Angstrom/min.

PRACTICAL EXAMPLE 2

Five deposition solutions, each having a volume of 1 liter, were prepared by mixing the following components with an increase in the content of each component: 50 g to 100 g of citric acid monohydrate ($C_6O_7H_8xH_2O$) with 10 g difference between the subsequent solutions; 15 ml to 27 ml of a 50 wt. % hypophosphorous acid ($H_3PO_2$) (reducing agent) with 3 ml difference between the subsequent hypophosphorous acids; 18 g to 26 g of cobalt sulfate heptahydrate ($CoSO_4x7H_2O$) with 2 g difference between subsequent cobalt sulfate heptahydrates; 24 g to 36 g of boric acid ($H_3BO_3$ with 3 g difference between the subsequent boric acids; 11 g to 16 g of tungsten (VI) oxide ($WO_3$) with 1.5 g difference between the subsequent; and an appropriate amount of TMAH for each solution required to reach an appropriate alkaline pH. After complete dissolution of tungsten (VI) oxide, dimethylaminoborane was in an amount 1 g/l.

The deposition on copper was performed at a bath temperature of 75° C. The deposition rates were within the range of 180 to 220 Angstrom/min. The composition of the obtained coating film was determined with the use of SIMS showed that the film contained 5–6 atomic % phosphorous, 7.0–7.5 atomic % tungsten, and cobalt as balance. Furthermore, the results of the SIMS analysis showed that the content of Na and K did not exceed $2\times10^{-4}$ atomic % (2 ppm).

COMPARATIVE EXAMPLE 3

The deposition process was performed under the same conditions as in Practical Example 2, with the exception that dimethylaminoborane was added in an amount lower than 1 g/l. The deposited film had lower adhesion to the substrate.

COMPARATIVE EXAMPLE 4

The deposition process was performed under the same conditions as in Practical Example 2, with the exception that dimethylaminoborane was added in an amount greater than 2 g/l. The composition of the deposited film had an increased content of boron.

Thus it has been shown that the solution and method of the invention provide a single-stage process for electroless deposition of a cobalt capping/passivation layer on copper interconnects with the use of one or more initiation agents that improves barrier properties of the layer, can be completed in a short period of time and at lower cost, and does not require activation in a multiple-stage process. Autocatalysis, which is used in the method of the invention, is based on interaction of a substrate with a reagent in the coordination sphere of a metal complex.

The deposition initiator was illustrated as a reducing agent. However other borane compounds, such as aminealkylboranes, which can form a catalytic layer for electroless deposition and which do not modify appreciably the film properties, such as the composition, morphology, crystallinity, porosity, corrosion resistance, and which are compatible with other components of the electroless bath, can be regarded as deposition initiators.

The invention has been shown and described with reference to specific embodiments, which should be construed only as examples and do not limit the scope of practical applications of the invention. Therefore any changes and modifications in technological processes, constructions, materials, shapes, and their components are possible, provided these changes do not depart from the scope of the attached patent claims. For example, the initiator agent may function as a reducing agent and vice versa. Other additives from those listed in the description can be added to the electroless solution of the invention, provided they are not in conflict with the purposes and results of the electroless deposition method of the invention.

What is claimed is:

1. An electroless deposition solution for deposition of cobalt onto a substrate, comprising:
    at least one cobalt ion source; and
    at least two reducing agents for reducing ions of said at least one cobalt ion source, wherein the at least two reducing agents comprise:
        a first reducing agent for initiating deposition of a first layer of cobalt on said substrate; and
        a second distinct reducing agent for continuing the deposition of cobalt above said substrate, wherein the second reducing agent is substantially absent of alkali metals.

2. The electroless deposition solution of claim 1, wherein said source of cobalt is selected from salts of cobalt (II).

3. The electroless deposition solution of claim 1, wherein said first reducing agent comprises at least one aminoborane.

4. The electroless deposition solution of claim 3, wherein said at least one aminoborane is a dimethylaminoborane.

5. The electroless deposition solution of claim 4, wherein said at least one aminoborane is a dimethylaminoborane used in concentration within the range of approximately 1 g/l to approximately 2 g/l.

6. The electroless deposition solution of claim 1, wherein said electroless deposition solution has a pH value not exceeding 10.

7. A single-stage method for electroless deposition of a cobalt layer on a copper surface, comprising:
    preparing an electroless deposition solution by mixing at least one cobalt ion source with a first reducing comprising boron and a second reducing agent substantially free of alkali metals and distinct from the first reducing agent; and
    exposing the copper surface to the electroless deposition solution to form the cobalt layer.

8. The method of claim 4, wherein the step of preparing the electroless deposition solution comprises preparing an electroless deposition comprising a concentration of aminoboranes between approximately 100 ppm and approximately 5,000 ppm.

9. The method of claim 8, wherein the step of exposing the copper surface comprises maintaining the electroless deposition solution at a temperature between approximately 20° C. and approximately 110° C.

10. The electroless deposition solution of claim 1, wherein a concentration of the second reducing agent is at least approximately 20 times larger than a concentration of the first reducing agent.

11. The electroless deposition solution of claim 1, wherein the second reducing agent comprises hypophosphorous acid.

12. The electroless deposition solution of claim 1, wherein the second reducing agent comprises ammonium hypophosphite.

13. The electroless deposition solution of claim 1, wherein the second reducing agent comprises hydrazine.

14. The method of claim 9, wherein the step of exposing the copper surface comprises maintaining the electroless deposition solution at a temperature between approximately 75° C. and approximately 100° C.

15. The method of claim 7, wherein the method is substantially absent of catalytic activation process on the copper surface prior to the step of exposing the copper surface to the electroless deposition solution.

16. The method of claim 7, wherein the step of preparing the electroless deposition solution comprises preparing an electroless deposition comprising a concentration of the second reducing agent between approximately 2000 ppm and approximately 500,000 ppm.

17. The method of claim 7, wherein the step of exposing the copper surface comprises depositing a cobalt film having a negligible amount of boron.

18. The method of claim 7, wherein the step of exposing the copper surface comprises depositing a cobalt film having a concentration of alkali metals less than approximately 2 ppm.

19. The method of claim 7, wherein the step of exposing the copper surface comprises depositing the cobalt film at a rate between approximately 180 angstroms/minute and approximately 220 angstroms/minute.

20. The method of claim 7, wherein the first reducing agent comprises dimethylaminoborane.

21. The method of claim 7, wherein the second reducing agent comprises hypophosphorous acid.

22. The method of claim 7, wherein the second reducing agent comprises ammonium hypophosphite.

23. The method of claim 7, wherein the second reducing agent comprises hydrazine.

24. An electroless deposition solution, comprising:
  cobalt ions;
  at least two reducing agents configured to reduce the cobalt ions to a cobalt film, wherein the at least two reducing agents comprise:
    a first reducing agent comprising an aminoborane; and
    a second distinct reducing agent comprising phosphorous and substantially absent of an alkali metal.

25. The electroless deposition solution of claim 24, wherein the first reducing agent comprises dimethylaminoborane.

26. The electroless deposition solution of claim 24, wherein the second reducing agent comprises hypophosphorous acid.

27. The electroless deposition solution of claim 24, wherein the second reducing agent comprises ammonium hypophosphite.

28. The electroless deposition solution of claim 24, wherein the second reducing agent comprises hydrazine.

29. The electroless deposition solution of claim 24, wherein a concentration of the second reducing agent is at least approximately 20 times larger than a concentration of the first reducing agent.

30. The electroless deposition solution of claim 24, wherein a concentration of the first reducing agent is between approximately 0.001 mol/L and approximately 0.01 mol/L.

31. The electroless deposition solution of claim 24, comprising a pH less than or equal to 10.

32. The electroless deposition solution of claim 24, further comprising metal ions other than the cobalt ions.

33. The electroless deposition solution of claim 32, wherein the metal ions other than the cobalt ions are selected from the group of metal ions consisting of chromium ions, molybdenum ions, and tungsten ions.

34. The electroless deposition solution of claim 33, wherein a source of the tungsten ions comprise a tungsten (VI) compound.

* * * * *

UNITED STATES PATENT AND TRADEMARK OFFICE
CERTIFICATE OF CORRECTION

PATENT NO. : 6,902,605 B2
DATED : June 7, 2005
INVENTOR(S) : Kolics et al.

It is certified that error appears in the above-identified patent and that said Letters Patent is hereby corrected as shown below:

<u>Column 10,</u>
Line 32, after "first reducing", insert -- agent --.
Line 38, after "method of claim", delete "4" and substitute -- 7 --.

Signed and Sealed this

Thirteenth Day of June, 2006

JON W. DUDAS
*Director of the United States Patent and Trademark Office*